(12) United States Patent
Nakada

(10) Patent No.: US 6,545,626 B1
(45) Date of Patent: Apr. 8, 2003

(54) INPUT DELAY CORRECTING SYSTEM AND METHOD FOR A/D CONVERTER AND STORAGE MEDIUM

(75) Inventor: Juichi Nakada, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/961,310

(22) Filed: Sep. 25, 2001

(30) Foreign Application Priority Data

Sep. 26, 2000 (JP) ........................................ 2000-291565

(51) Int. Cl.[7] ............................. H03M 1/12; H03M 1/06
(52) U.S. Cl. ........................ 341/155; 341/118; 341/120
(58) Field of Search ................................. 341/155, 120, 341/118, 119

(56) References Cited

U.S. PATENT DOCUMENTS 5,956,371 A * 9/1999 Yamane ........................ 375/232
6,384,756 B1 * 5/2002 Tajiri et al. .................. 341/120

* cited by examiner

Primary Examiner—Michael Tokar
Assistant Examiner—Jean Bruner Jeanglaude
(74) Attorney, Agent, or Firm—Lowe Hauptman Gilman & Berner, LLP

(57) ABSTRACT

An input delay correcting system for an interleave type A/D converter is to be provided. Even if sampling clock signals fed to A/D converters 22 and 24 are not exactly shifted a half cycle from each other, a digital signal outputted from an output terminal 30d of an FIR filter 30 becomes a pulse of a tuning exactly shifted a half cycle from the sampling clock signal fed to the A/D converter 22. A digital signal outputted from an output terminal 30c of the FIR filter 30 corresponds to a signal resulting from delaying an output of the A/D converter 22 by an integer multiple of the sampling clock signal cycle. Therefore, if the outputs from the output terminals 30c and 30d of the FIR filter 30 are made alternate by a multiplexer 40, the outputs of the A/D converters 22 and 24 can be exactly shifted a half cycle with respect to the sampling clock signals fed thereto.

3 Claims, 12 Drawing Sheets

Impulse Response

Impulse Response

INPUT DELAY CORRECTING SYSTEM AND METHOD FOR A/D CONVERTER AND STORAGE MEDIUM

BACKGROUND OF INVENTION

1. Field of Invention

The present invention relates to an input delay correction for an interleave type AID (Analog to Digital) converter.

2. Description of the Related Art

With speed-up, for example, of a device under test (DUT), speed-up of an A/D converter for use in conveying an analog signal outputted from the DUT into a digital signal for example has been demanded so far. The interleave type AID converter is for attaining the speed-up of an A/D converter.

An example of an interleave type A/D converter is shown in FIG. 10. An analog signal outputted from a DUT 102 is inputted to A/D converters 112 and 114. A sampling clock A is provided to the A/D converter 112, while a sampling dock B is provided to the A/D converter 114. The sampling clock B is delayed a half cycle from the sampling clock A. The cycle of the sampling clock A and that of the sampling clock B are both assumed equal to 100 [ns]. The A/D converter 112 outputs digital signals D0, D2, D4, . . . , while the A/D converter 114 outputs digital signals D1, D3, D5, . . . The digital signals outputted from the A/D converters 112 and 114 are outputted as D0, D1, D2, D3, D4, . . . through a multiplexer 120.

FIG. 11 is a time chart of an entire sampling clock and the sampling clocks A and B. First, as to the sampling clock A, a clock signal corresponding to D0 is outputted, then in 100 [ns] after that there is outputted a clock signal corresponding to D2, and further in 100 [ns] after that there is outputted a clock signal corresponding to D4. As to the sampling clock B, a clock signal corresponding to D1 is outputted a half cycle, i.e., 50 [ns], later than a clock signal corresponding to D0 and in 100 [ns] after that there is outputted a clock signal corresponding to D3. Thus, as shown at the top stage in FIG. 11, the entire sampling clock is a combination of both sampling clocks A and B, i.e., D0, D1, D2, D3, D4, . . . In this case, the cycle of the entire sampling clock is 50 [ns].

Thus, by using two A/D converters (112 and 114), sampling can be done with a half cycle of the ordinary sampling cycle. For example, sampling with a cycle of 100 [ns] can be made into sampling with a cycle of 50 [ns]. More than two A/D converters may be used. If three A/D converters are used, sampling can be done with a one-third cycle, and if four A/D converters are used, sampling can be done with a one-fourth cycle. For example, if four A/D converters are used, sampling with a cycle of 100 [ns] can be made into sampling with a cycle of 25 [ns].

SUMMARY OF INVENTION

However, for reducing the sampling cycle exactly to half, it is necessary that a time lag between the sampling clocks A and B be set exactly at a half cycle. For example, as shown in FIG. 12(a), it is here assumed that the sampling clock B is delayed by τ relative to a time at which it should be. Such a phenomenon is called an input delay. In this case, an entire sampling clock is as shown in FIG. 12(b). The spacing of clock signals corresponding to D0, D1, and D2 should be 50 [ns], but, as shown in the same figure, the spacing between clock signals corresponding to D0 and D1 is 50+τ [ns], while the spacing between clock signals corresponding to D1 and D2 is 50−τ [ns]. It is evident that such non-uniform sampling cycles are inconvenient.

Accordingly, it is an object of the present invention to provide an input delay correcting system, etc. for an A/D converter.

According to an embotiment of the present invention, an input delay correcting system for an A/D converter, operating at the time of receiving an analog signal and outputting a digital signal, the system includes: a plurality of A/D converter unit for converting the analog signal into digital signals in synchronism with a sampling clock signal; a clock signal supply unit which supplies the sampling clock signal in different phases to the A/D converter unit; a delay unit which delays an output of each the A/D converter unit by a time corresponding to a cycle of the sampling clock signal; a multiplier unit which multiplies outputs of the delay unit by predetermined coefficients and which outputs the thus-multiplied signals; a totalizer unit which outputs the total of outputs provided from the multiplier unit; and an alternate output unit which outputs an output of the delay unit and, an output of the totalizer unit in an alternate manner, the output of the delay unit being spaced a predetermined time from a time point at which the output of the totalizer unit takes a maximum value.

According to the thus constructed input delay correcting system for an A/D converter, the delay unit, the multiplier unit and the totalizer unit constitute so called FIR (Finite Impulse Response) filter. Since the timing at which the output of the FIR filter takes a maximum value is constant, even with an input delay found in any of plural A/D converter means, the input delay can be corrected if a signal provided when the output of the FIR filter takes a maximum value is used as digital signal.

According to an embotiment of the present invention, an input delay correcting method for an input delay correcting system for an A/D converter having a plurality of A/D converter unit for converting analog signal into digital signals in synchronism with a sampling clock signal; and, a clock signal supply unit which supplies the sampling clock signal in different phases to the A/D converter unit, the method includes: a delay step which delays an output of each the A/D converter unit by a time corresponding to a cycle of the sampling clock signal; a multiplier step which multiplies outputs of the delay step by predetermined coefficients and which outputs the thus-multiplied signals; a totalizer step which outputs the total of outputs provided from the multiplier step; and an alternate output step which outputs an output of the delay step and an output of the totalizer step in an alternate manner; the output of the delay step being spaced a predetermined time from a time point at which the output of the totalizer step takes a maximum value.

According to an embotiment of the present invention, a computer-readable medium has a program of instructions for execution by the computer to perform an input delay correcting process for an input delay correcting system for an A/D converter having a plurality of A/D converter unit for converting analog signal into digital signals in synchronism with a sampling clock signal; and a clock signal supply unit which supplies the sampling clock signal in different phases to the A/D converter unit. The input delay correcting process includes: a delay processing which delays an output of each the A/D converter unit by a time corresponding to a cycle of the sampling clock signal; a multiplier processing which multiplies outputs of the delay processing by predetermined coefficients and which outputs the thus-multiplied signals; a totalizer processing which outputs the total of outputs provided from the multiplier processing; and an alternate output processing which outputs an output of the delay processing and an output of the totalizer processing in an alternate manner; the output of the delay processing being spaced a predetermined time from a time point at which the output of the totalizer processing takes a maximum value.

DESCRIPTION OF THE PREFERRED EMBODIMENTS

An embotiment of the present invention will be described hereinunder with reference to the accompanying drawings.

Figure 1:
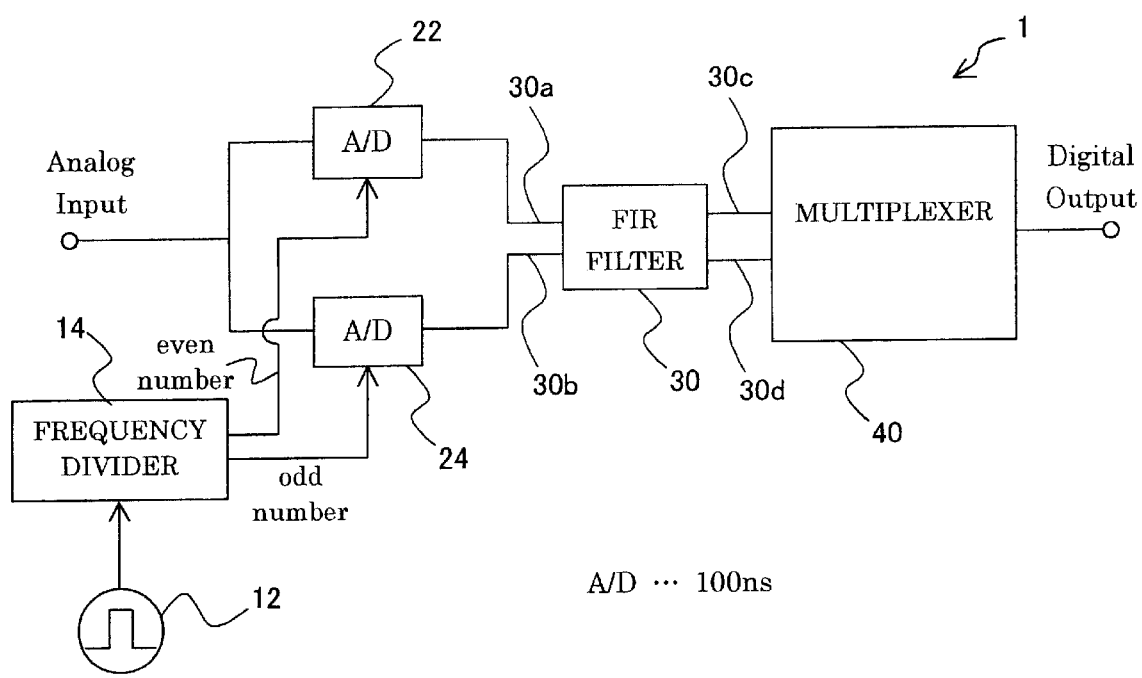
FIG. 1 is a block diagram showing the configuration of an input delay correcting system 1 for an A/D converter according to an embotiment of the present invention.

FIG. 1 is a block diagram showing the construction of an input delay correcting system 1 for an A/D converter according to an embotiment of the present invention. The input delay correcting system 1 comprises a clock signal source 12, a frequency divider 14, A/D converters 22 and 24, an FIR (Finite Impulse Response) filter 30, and a multiplexer 40.

The clock signal source 12 produces a clock signal having a certain cycle. The frequency divider 14 divides the frequency of the clock signal produced by the clock signal source 12 and supplies an even-number pulse to the A/D converter 22 and an odd-number pulse to the A/D converter 24 The pulses fed to the A/D converters 22 and 24 are designated sampling clock signals and the cycle thereof is set at 100 [ns]. The phase of the sampling clock signal fed to the A/D converter 22 and that of the sampling clock signal fed to the A/D converter 24 are 180° out of phase with each other.

The A/D converters 22 and 24 convert inputted analog signals into digital signals in synchronism with sampling clock signals. The analog signals inputted to the A/D converters 22 and 24 are the same signal. Besides, the phases of the sampling clock signals are 180° out of phase with each other. Thus, the A/D converters 22 and 24 constitute so-called interleave type A/D converters.

The FIR filter 30 has input terminals 30a, 30b and output terminals 30c, 30d. An output of the A/D converter 22 is inputted to the input terminal 30a. An output of the A/D converter 24 is inputted to the input terminal 30b. The signal inputted to the input terminal 30a is delayed and outputted from the output terminal 30c. Further, a signal obtained by applying a predetermined processing to the signals inputted to the input terminals 30a and 30b is outputted from the output terminal 30d.

Figure 2:
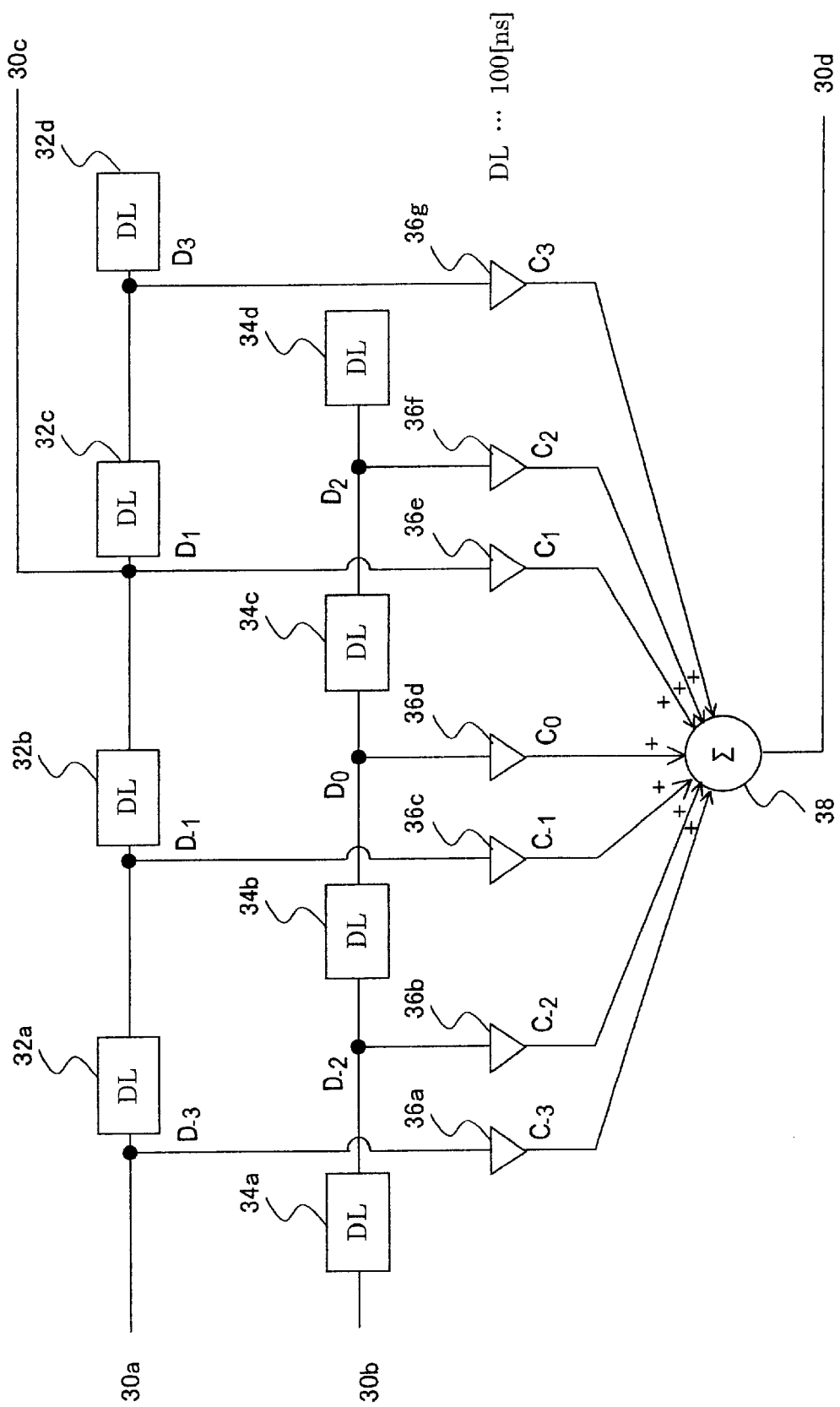
FIG. 2 is a block diagram showing an internal configuration of an FIR filter 30.

An internal configuration of the FIR filter 30 is shown in FIG. 2. The FIR filter 30 is further provided with delay units (buffers) 32a–32d, 34a–34d, multipliers 36a–36g, and a totalizer 38.

The delay units 32a–32d each delay a signal inputted to the input terminal 30a by a time corresponding to a cycle (here 100 [ns]) of the sampling clod signal and output the thus-delayed signal. The delay unit 32a delays the signal inputted to the input termial 30a by a time corresponding to the cycle of the sampling clock signal and outputs the thus-delayed signal. The delay unit 32b delays the output signal of the delay unit 32a by the cycle of the sampling clock signal and outputs the thus-delayed signal. The delay unit 32c delays the output signal of the delay unit 32b by the cycle of the sampling clock signal and outputs the thus-delayed signal. The delay unit 32d delays the output signal of the delay unit 32c by the cycle of the sampling clock signal and outputs the thus-delayed signal. It is here assumed that the signal inputted to the delay unit 32a is $D_{-3}$, the signal outputted from the delay unit 32a is $D_{-1}$, the signal outputted from the delay unit 32b is $D_1$, and the signal outputted from the delay unit 32c is $D_3$.

The delay units 34a–34d each delay a signal inputted to the input terminal 30b by a time corresponding to a cycle (here 100 [ns]) of the sampling clock signal and outputs the thus-delayed signal. The delay unit 34a delays the signal inputted to the input terminal 30b by the cycle of the sampling clock signal and outputs the thus-delayed signal. The delay unit 34b delays the output signal of the delay unit 34a by the cycle of the sampling clock signal and outputs the thus-delayed signal. The delay unit 34c delays the output signal of the delay unit 34b by the cycle of the sampling clock signal and outputs the thus-delayed signal. The delay unit 34d delays the output signal of the delay unit 34c by the cycle of the sampling clock signal and outputs the thus-delayed signal. The output signals from the delay units 34a, 34b, and 34c are assumed to be $D_{-2}$, $D_0$, and $D_2$, respectively.

The output terminal 30c is connected to an output terminal of the delay unit 32b. The signal $D_1$ is outputted to the output terminal 30c.

The multipliers 36a–36g multiply, for example, the outputs of the delay units by predetermined coefficients and output the results obtained. The multiplier 36a multiplies the signal $D_{-3}$ by a coefficient $C_{-3}$ and outputs the result obtained. The multiplier 36b multiplies the signal $D_{-2}$ by a coefficient $C_{-2}$ and outputs the result obtained. The multiplier 36c multiplies the signal $D_{-1}$ by a coefficient $C_{-1}$ and outputs the result obtained. The multiplier 36d multiplies the signal $D_0$ by a coefficient $C_0$ and output the result. The multiplier 36e multiplies the signal $D_1$ by a coefficient $C_1$ and outputs the result obtained. The multiplier 36f multiplies the signal $D_2$ by a coefficient $C_2$ and outputs the result obtained. The multiplier 36g multiplies the signal $D_3$ by a coefficient $C_3$ and outputs the result obtained.

The totalizer 38 totals the outputs of the multipliers 36a–36g and outputs the result obtained to the output terminal 30d.

Figure 3:
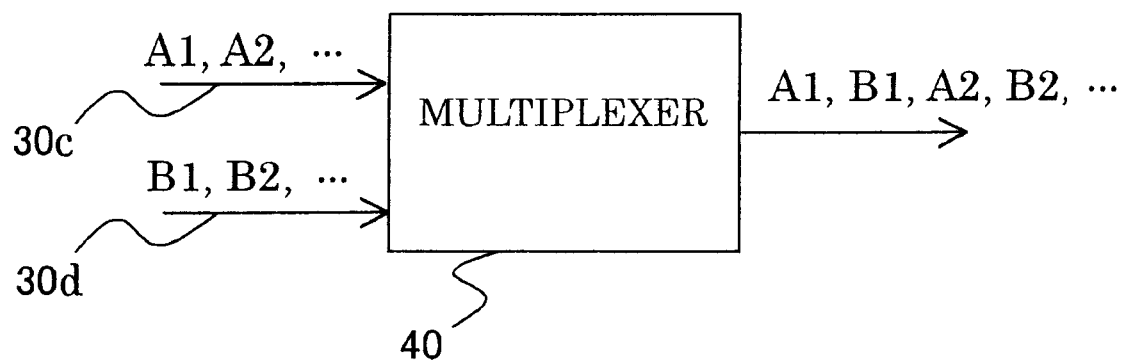
FIG. 3 is a diagram showing an output mode of a multiplexer 40.

Using the output terminals 30c and 30d of the FIR filter 30 as input terminals, the multiplexer 40 alternately outputs signals which are inputted from the output terminals 30c and 30d. The multiplexer 40 outputs in such a mode as show in FIG. 3. When signals A1, A2, . . . and signals B1, B2, . . . are inputted to the multiplexer 40 from the output terminals 30c and 30d, respectively, of the FIR filter 30, the multiplexer outputs signals A1, B1, A2, B2, . . .

A description will be given below about the operation of the input delay correcting system 1 for an A/D converter according to this embodiment. The following description is concerned with the case where sampling clock signals fed to the A/D converters 22 and 24 are exactly 180° out of phase with each other.

Analog signals are inputted to the A/D converters 22 and 24. In synchronism with sampling clock signals fed from the frequency divider 14 the A/D converters 22 and 24 convert the analog signals into digital signals and output the digital signal. The frequency of a clock signal produced from the clock signal source 12 is divided by the frequency divider 14 to produce the sampling clock signals.

The output of the A/D converter 22 is inputted to the input terminal 30a of the FIR filter 30, while the output of the A/D converter 24 is inputted to the input terminal 30b of the FIR filter 30. The signals applied to the input terminals 30a and 30b are shown in FIGS. 4(a) and 4(b), respectively.

Figure 4:
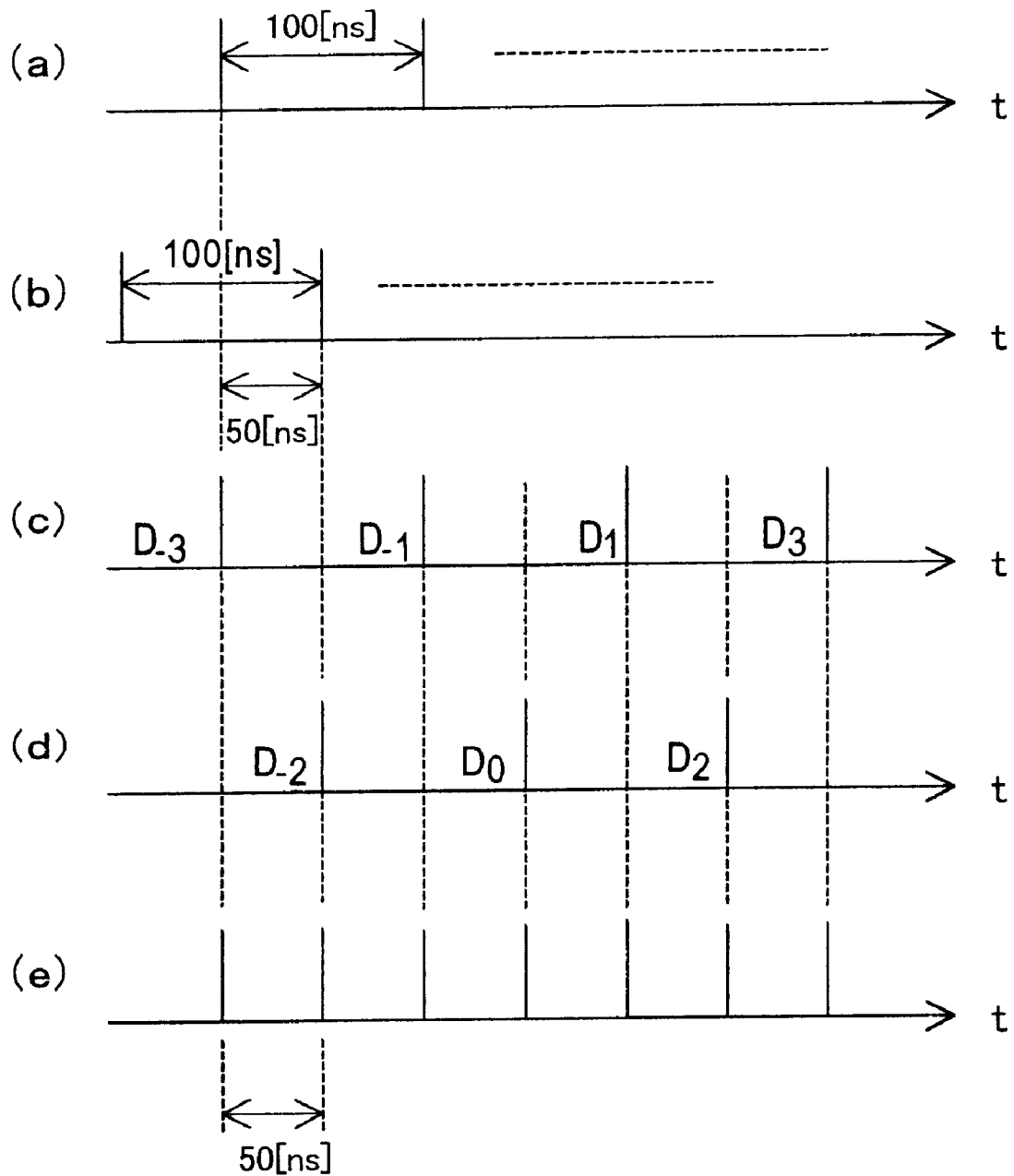
FIG. 4 is a time chart showing a digital signal (FIG. 4(a)) fed to an input terminal 30a, a digital signal (FIG. 4(b)) fed to an input terminal 30b, input and output signals (FIG. 4(c)) in delay units 32a–32c, output signals (FIG. 4(d)) from delay units 34a–34c, and input signals (FIG. 4(e)) to multipliers 36a–36g, in the case where sampling clock signals fed to A/D converters 22 and 24 are exactly 180° out of phase.

As shown in FIGS. 4(a) and 4(b), the outputs of the A/D converters 22 and 24 are shifted a half cycle from each other. It follows that both are shifted 50 [ns] from each other because the sampling clock cycle is set at 100 [ns]

FIG. 4(c) shows signals obtained as a result of an initial signal (the left-end pulse in FIG. 4(a)) fed to the input terminal 30a having been delayed by the delay units 32a–32c. A signal $D_{-3}$ is produced simultaneously with the initial signal fed to the input terminal 30a. A signal $D_{-1}$ is delayed one cycle from the signal $D_{-3}$ by the delay unit 32a. A signal $D_1$ is delayed one cycle from the signal $D_{-1}$ by the delay unit 32b. A signal $D_3$ is delayed one cycle from the signal $D_1$ by the delay unit 32c.

FIG. 4(d) shows signals obtained as a result of an initial signal (the left-end pulse in FIG. 4(b)) fed to the input terminal 30b having been delayed by the delay units 34a–34c. A signal $D_{-2}$ is delayed one cycle from the initial signal fed to the input terminal 30b by the delay unit 34a. A signal $D_0$ is delayed one cycle from the signal $D_{-2}$ by the delay unit 34b. A signal $D_2$ is delayed one cycle from the signal $D_0$ by the delay unit 34c.

FIG. 4(e) shows signals inputted to the multipliers 36a–36g. Signals $D_{-3}$, $D_{-2}$, $D_{-1}$, $D_0$, $D_1$, $D_2$, and $D_3$ are inputted to the multipliers 36a–36g, respectively. Thus, pulses spaced a half cycle of the sampling clock signal, i.e., 50 [ns], from one another are inputted to the multipliers 36a–36g, respectively.

Figure 5:
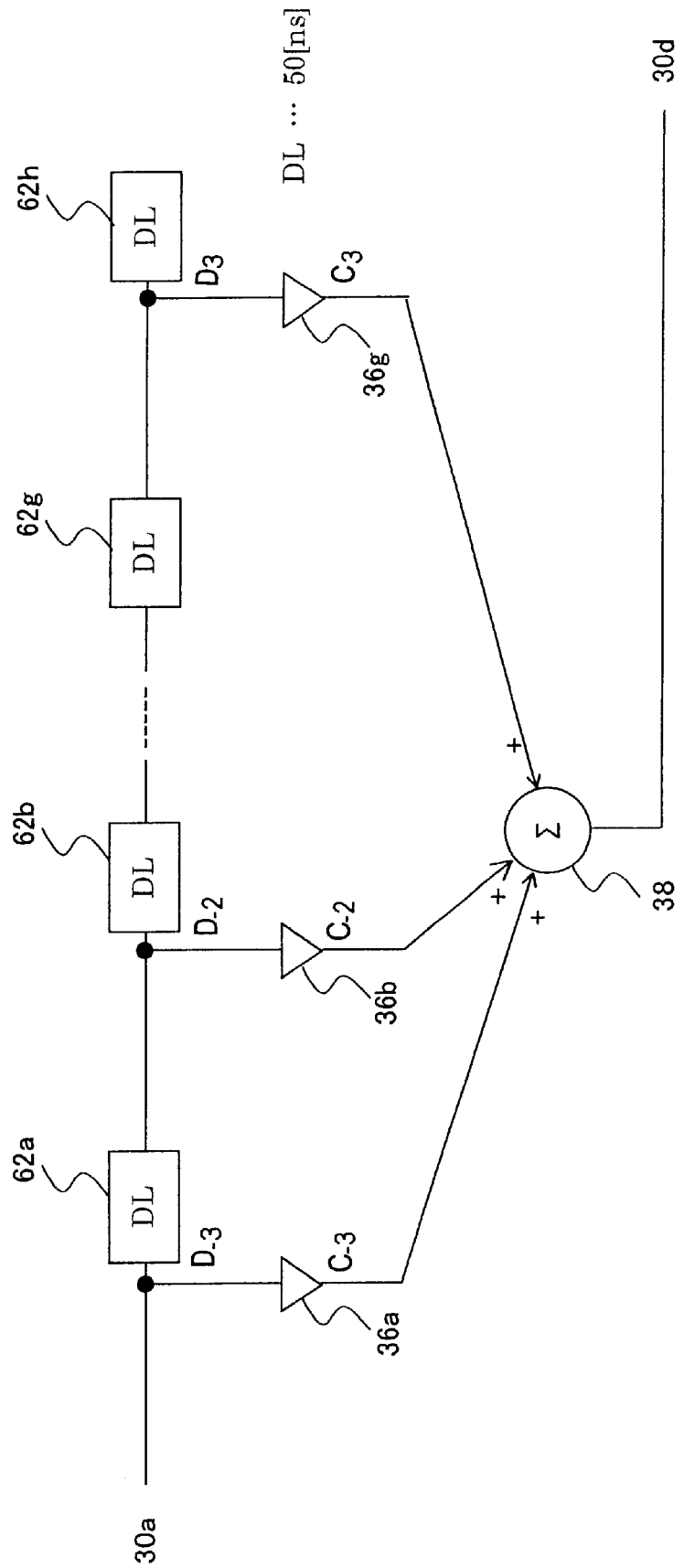
FIG. 5 is a block diagram showing an ordinary type of FIR filter which is equivalent to the FIR filter 30.

An internal configuration of the FIR filter shown in FIG. 2 is equivalent to an ordinary type of FIR filter shown in FIG. 5. The ordinary type of FIR filter shown in FIG. 5 has an input terminal 30a, delay units 62a–62h, multipliers 36a–36g, and a totalizer 38. The input terminal 30a, the multipliers 36a–36g, and the totalizer 38 are of the same internal configuration as that of the FIR filter shown in FIG. 2. The delay units 62a–62h delay inputted signals a half cycle of the sampling clock signal, i.e., 50 [ns], and output the thus-delayed signals. The multipliers 36a–36g multiply a signal $D_{-3}$ before input to the delay unit 62a, a signal $D_{-2}$ outputted from the delay unit 62a, . . . , and a signal $D_3$ outputted from the delay unit 62g by predetermined coefficients $C_{-3}$, $C_{-2}$, . . . , and $C_3$ and output the results thus obtained. The totalizer 38 totals the outputs of the multipliers 36a–36g and outputs the result to the output terminal 30d.

Figure 6:
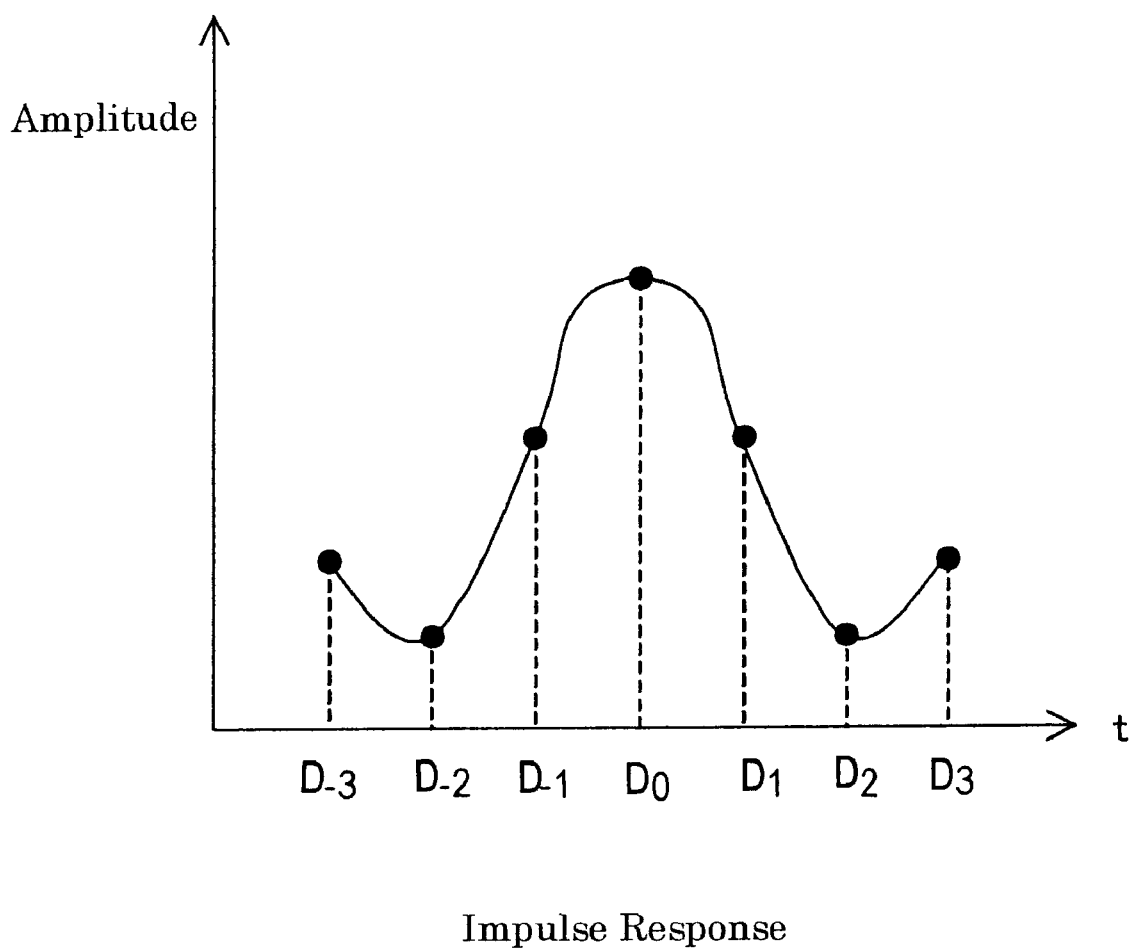
FIG. 6 is a graph showing an impulse response of the FIR filter 30.
Figure 7:
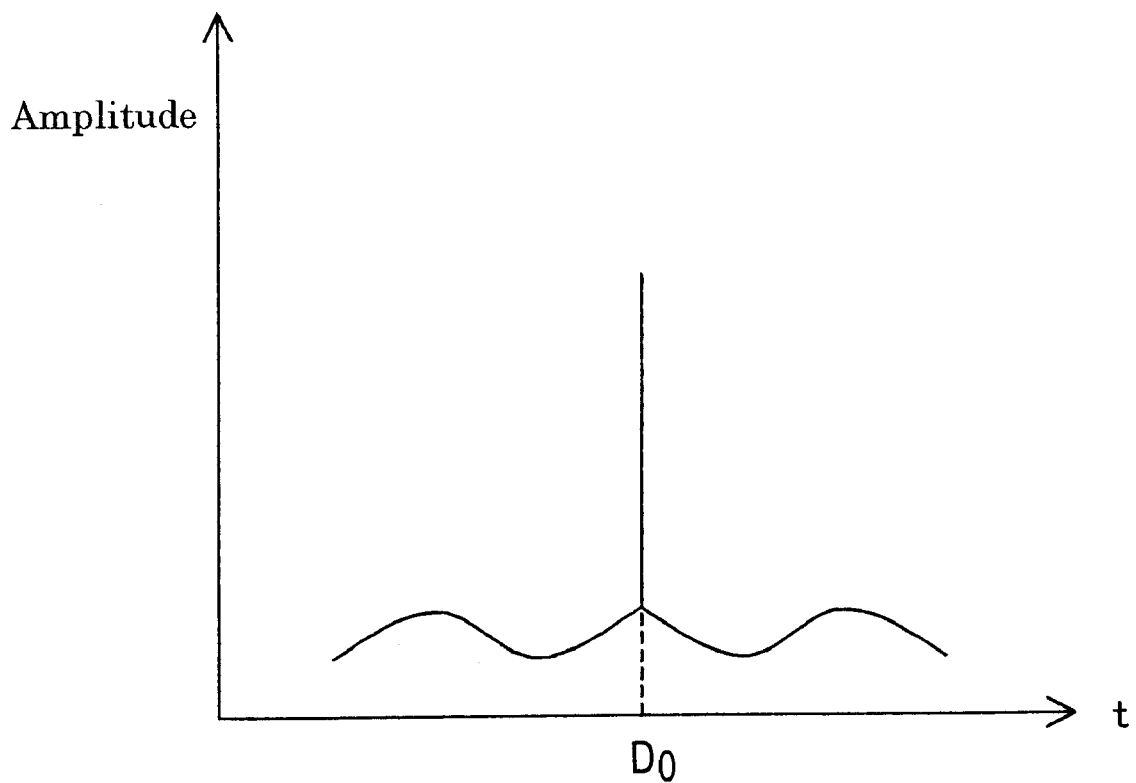
FIG. 7 is a graph showing a case where a maximum value is remarkably larger than other values in the impulse response of the FIR filter.

An output obtained upon input of a pulse to the FIR filter can be observed as an impulse response. The ordinary FIR filter shown in FIG. 5 can be allowed to function as a low-pass filter by setting the predetermined coefficients $C_{-3}$, $C_{-2}$, . . . , and $C_3$ at appropriate values. In this case, the impulse response of the FIR filter takes a maximum value generally when a signal is input to the multiplier 36d located centrally out of the multipliers 36a–36g, as shown in FIG. 6. In the same figure, $D_{-3}$, $D_{-2}$, . . . , and $D_3$ are plotted along a time base which is the axis of abscissa, indicating timings at which signals $D_{-3}$, $D_{-2}$, . . . , and $D_3$ are inputted to the multipliers 36a–36g, respectively. As shown in FIG. 6, if data related to the input of signals $D_{-3}$, $D_{-2}$, . . . , $D_3$ to the multipliers 36a–36g are interpolated, there is obtained a curved line which takes a maximum value when signal $D_0$ is inputted to the multiplier 36d. By increasing the number of multipliers and delay units, as shown in FIG. 7, the magnum output value of the FIR filter can be made extremely large in comparison with other values. Thus, the output signal from the FIR filter can be handled as a pulse signal which is outputted upon input of signal $D_0$ to the multiplier 36d. This pulse signal is provided to the output terminal 30d.

Referring to FIG. 2, a pulse signal, which is outputted upon input of signal $D_1$ to the multiplier 36e, is provided to the output terminal 30c. Thus, with reference to FIGS. 4(c) and 4(d), the signals which the multiplexer 40 outputs can be handled as pulse signals generated at the timings of signals $D_0$ and $D_1$. Since the spacing of the signals $D_0$ and $D_1$ is 50 [ns], it follows that pulse signals with a cycle of 50 [ns] are outputted from the multiplexer 40.

Next, a description will be given below about the case where the phase difference between the phase of the sampling clock signal fed to the A/D converter 22 and that fed to the A/D converter 24 is not exactly 180°.

Analog signals are inputted to the A/D converters 22 and 24, which in turn, in synchronism with sampling clock signals fed from the frequency divider 14, converts the analog signals into digital signals and output the digital signals. The sampling clock signals are each produced by dividing the frequency of the clock signal produced from the clock signal source 12, which division is made by the frequency divider 14.

The outputs of the A/D converters 22 and 24 are fed to the input terminals 30a and 30b, respectively, of the FIR filter 30. The signals applied to the input terminals 30a and 30b are shown in FIGS. 8(a) and 8(b), respectively.

Figure 8:
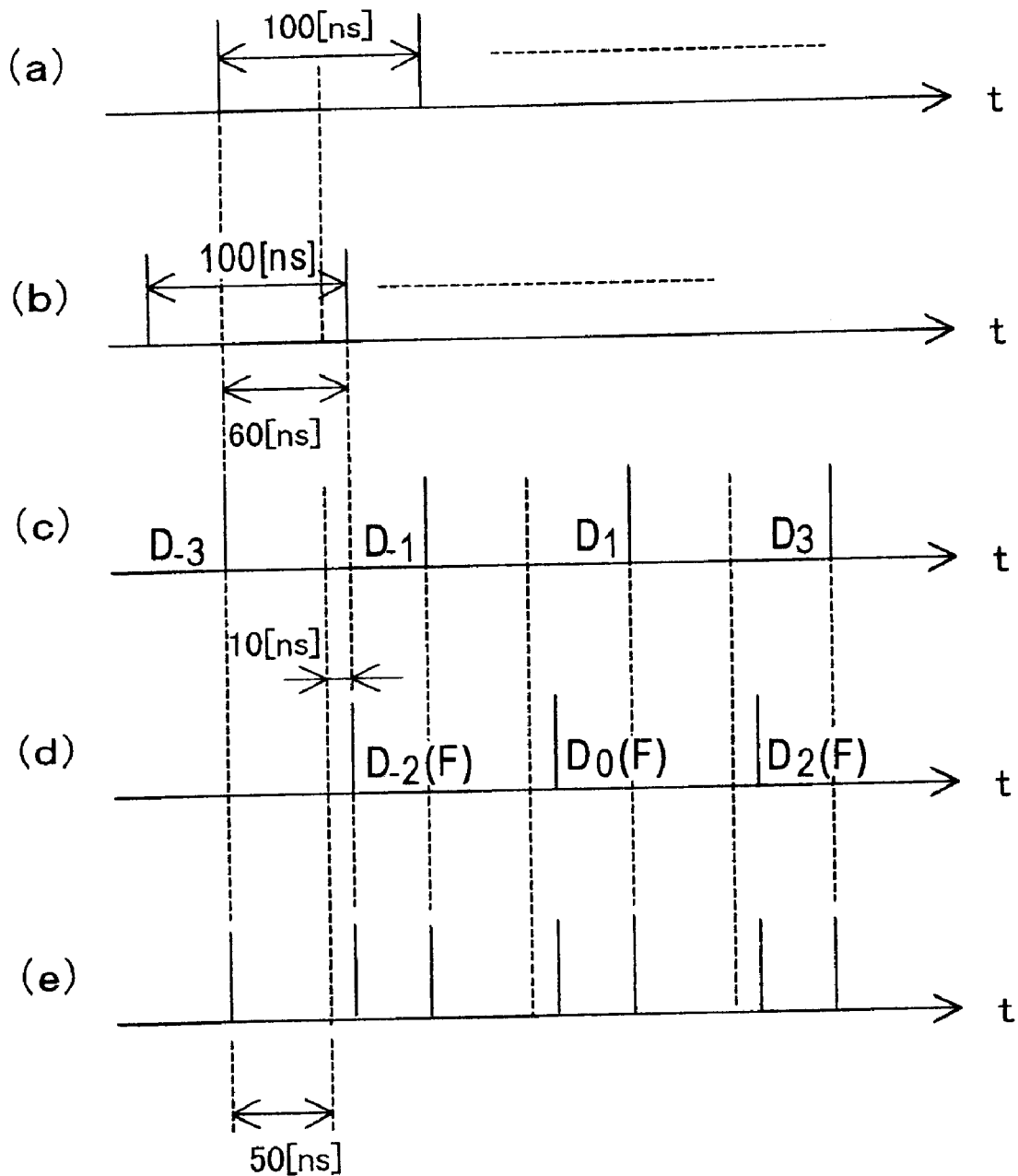
FIG. 8 is a timing chart showing a digital signal (FIG. 8(a)) fed to the input terminal 30a, a digital signal (FIG. 8(b)) fed to the input terminal 30b, input and output signals (FIG. 8(c)) in the delay units 32a–32c, output signals (FIG. 8(d)) from the delay units 34a–34c, and input signals (FIG. 8(e)) to the multipliers 36a–36g, in the case where a phase difference between sampling clock signals fed to the A/D converters 22 and 24 is not exactly 180°.

As shown in FIGS. 8(a) and 8(b), the outputs of the A/D converters 22 and 24 are shifted 60 [ns] from each other. Since the sampling clock cycle is 100 [ns], it follows that there is a further shift of 10 [ns] from the half cycle.

In FIG. 8(c) there are shown signals obtained as a result of an initial signal (the left-end pulse in FIG. 8(a)) fed to the input terminal 30a having been delayed by the delay units 32a–32c. A signal $D_{-3}$ is generated simultaneously with the initial signal fed to the input terminal 30a. A signal $D_{-1}$ is delayed one cycle from the signal $D_{-3}$ by the delay unit 32a. A signal $D_1$ is delayed one cycle from the signal $D_{-1}$ by the delay unit 32b. A signal $D_3$ is delayed one cycle from the signal $D_1$ by the delay unit 32c.

In FIG. 8(d) there are shown signals obtained as a result of an initial signal (the left-end pulse in FIG. 8(b)) fed to the input terminal 30b having been delayed by the delay units 34a–34c. A signal $D_{-2}$ is delayed one cycle by the delay unit 34a from the initial signal fed to the input terminal 30b. A signal $D_0$ is delayed one cycle from the signal $D_{-2}$ by the delay unit 34b. A signal $D_2$ is delayed one cycle from the signal $D_0$ by the delay unit 34c. In FIG. 8(d) there are described $D_{-2}(F)$, $D_0(F)$, and $D_2(F)$, which are suffixed by parenthesized capital F. The "F" is a capital letter of "False." This is for clarifying the failure due to the error despite 50 [ns] being correct. $D_{-2}(F)$, $D_0(F)$, and $D_2(F)$ are each shifted 10 [ns] from the timing which they should follow.

Figure 9:
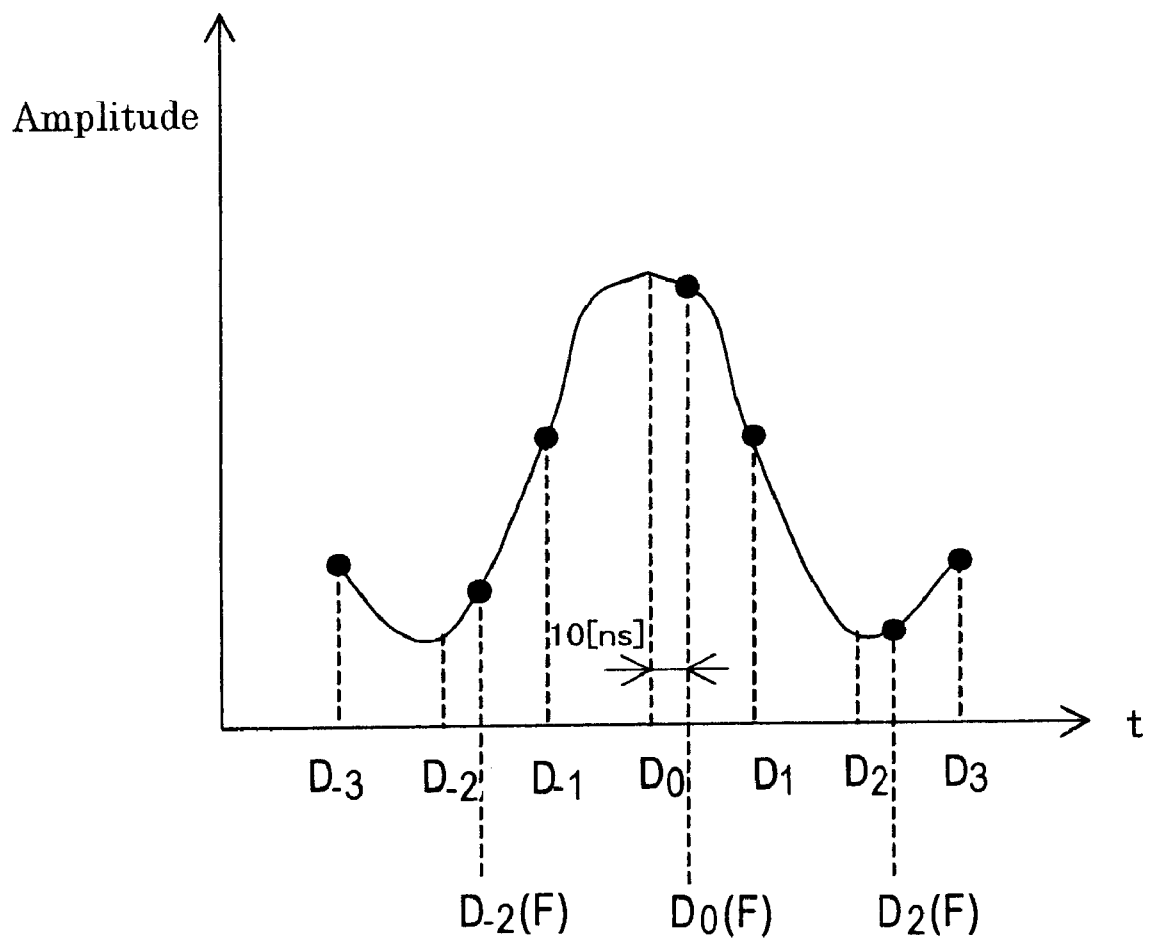
FIG. 9 is a graph showing an impulse response of the FIR filter 30.
Figure 10:
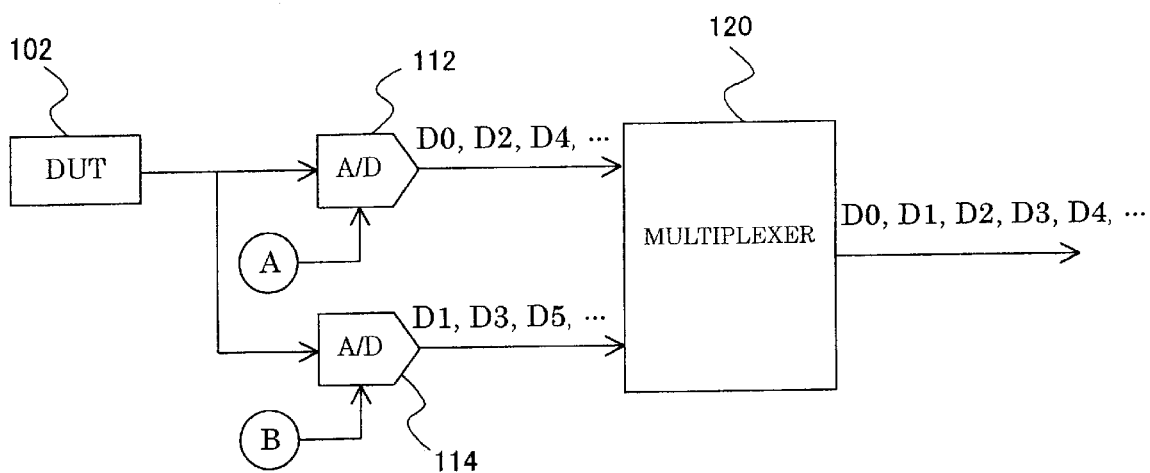
FIG. 10 is a block diagram showing an example of an interleave type A/D converter according to the prior art.
Figure 11:
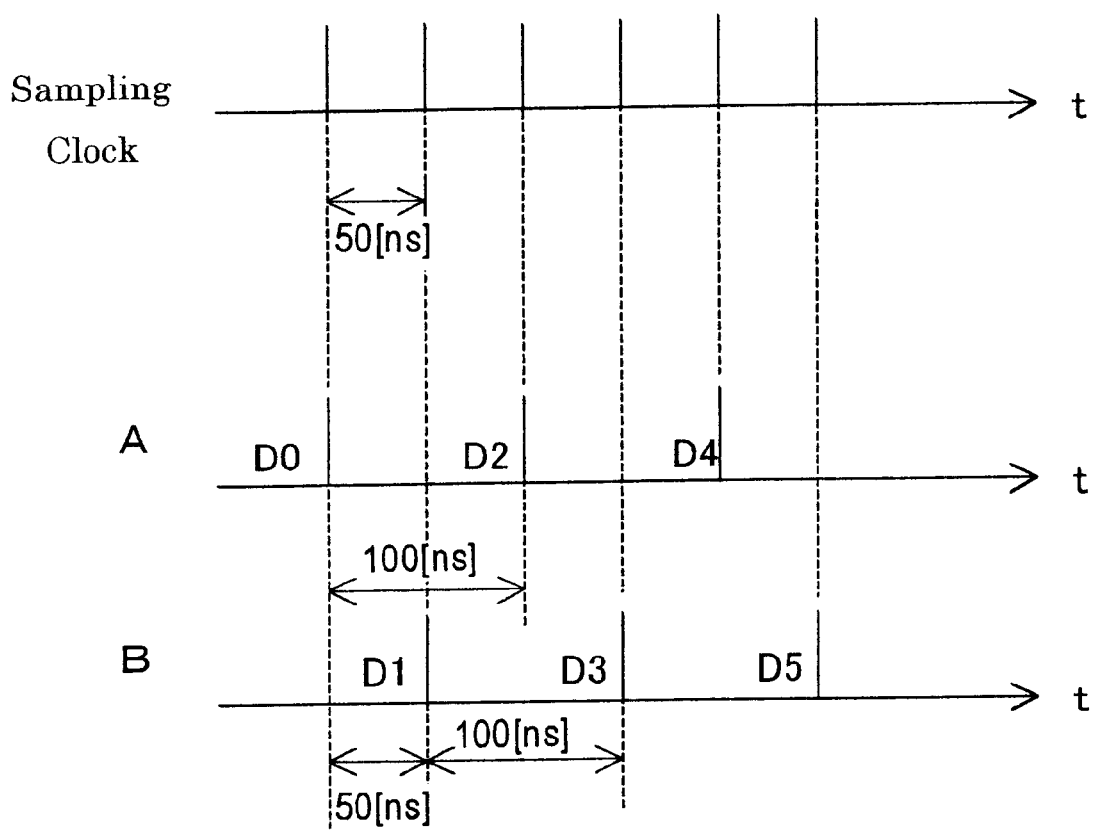
FIG. 11 is a time chart of an entire sampling clock, as well as sampling clocks A and B, in the prior art.
Figure 12A:
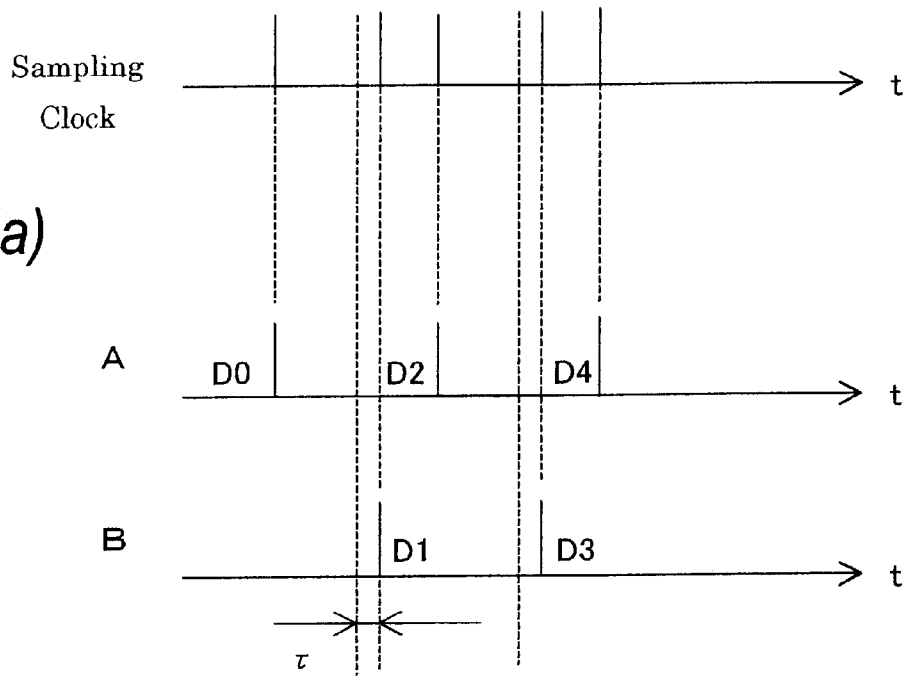
FIG. 12 is a time chart showing an input delay and (FIG. 12(a)) and an entire sampling clock (FIG. 12(b)) in the prior art.
Figure 12B:
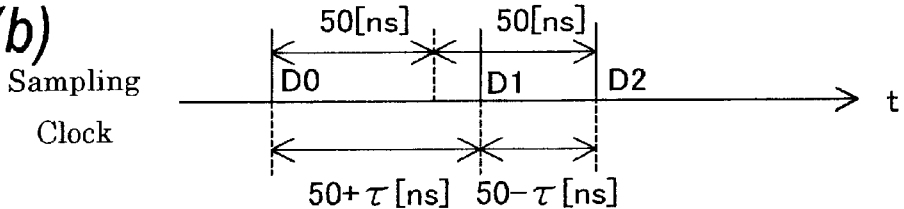

In FIG. 8(e) there are shown signals which are inputted to the multipliers 36a–36g. Signals $D_{-3}$, $D_{-2}(F)$, $D_{-1}$, $D_0(F)$, $D_1$, $D_2(F)$, and $D_3$ are respectively inputted to the multipliers 36a–36g. Thus, pulses spaced 60 [ns] and 40 [ns] are inputted to the multipliers 36a–36g. At this time there is obtained such an impulse response as shown in FIG. 9, in which timings for the measurement of impulse response are different from those in FIG. 6. More specifically, the measurement is made at the timings of signals $D_{-2}(F)$, $D_0(F)$, and $D_2(F)$ instead of the timings of signals $D_{-2}$, $D_0$, and $D_2$. However, it is not that the FIR filter 30 changed, but the FIR filter 30 remains the same. That is, the impulse response of the FIR filter 30 is the same in both FIGS. 9 and 6. Therefore, if the amplitudes measured at the timings of signals $D_{-3}$, $D_{-2}(F)$, $D_{-1}$, $D_0(F)$, $D_1$, $D_2(F)$, and $D_3$ are interpolated, there is obtained a curved line wherein the impulse response takes a maximum value upon input of signal $D_0$ to the multiplier 36d as is the case with FIG. 6.

Thus, an output signal from the FIR filter can be handled as a pulse signal which is outputted upon input of signal $D_0$ to the multiplier 36d. This pulse signal is fed to the output terminal 30d. Consequently, the output signal from the FIR filter corresponds to a signal obtained by correcting an error in the phase difference between the phase of the sampling clock signal fed to the A/D converter 22 and that fed to the A/D converter 24.

Referring now to FIG. 2, a pulse signal, which is outputted upon input of signal $D_1$ to the multiplier 36e, is fed to the output terminal 30c. Therefore, with reference to FIGS. 4(c) and (d), signals which the multiplexer 40 outputs can be handled as pulse signals generated at the timings of signals $D_0$ and $D_1$. Since the spacing between the signals $D_0$ and $D_1$ is 50 [ns], pulse signals with a cycle of 50 [ns] are outputted from the multiplexer 40.

According to this embodiment, even if the sampling clock signals fed to the A/D converters 22 and 24 are not exactly shifted a half cycle, the digital signal outputted from the output terminal 30d of the FIR filter 30 becomes a pulse of a timing exactly shifted a half cycle from the sampling clock signal fed to the A/D converter 22. Further, the digital signal provided from the output terminal 30c of the FIR filter 30 corresponds to a signal resulting from delaying the output of the A/D converter 22 by an integer multiple of the sampling clock signal cycle. Thus, if the outputs from the output terminals 30c and 30d of the FIR filter 30 are made alternate by the multiplexer 40, the outputs of the A/D converters 22 and 24 can be exactly shifted a half cycle from the sampling clock signal.

As A/D converters there are used A/D converters 22 and 24 in this embotiment, three or more A/D converters may be used.

The function described in the above embotiment can also be implemented by a method wherein a media reader of a computer provided with a CPU, a hard disc, and the media (eg., floppy disk and CD-ROM) reader is allowed to read a medium which stores programs for implementing the various portions described above, and the contents thus read are installed in the hard disc.

According to the present invention, the delay means, the multiplier means, and the totalizer means constitute what is called an FIR filter. Since the timing at which the output of the FIR filter takes a maximum value is constant, even with an input delay found in any of plural A/D converter means, the input delay can be corrected if a signal provided when the output of the FIR filter takes a maximum value is used as digital signal.

What is claimed is:

1. An input delay correcting system for an A/D converter, operating at the time of receiving an analog signal and outputting a digital signal, said system comprising:

a plurality of A/D converters for converting said analog signal into digital signals in synchronism with a sampling clock signal;

a clock signal supplier which supplies said sampling clock signal in different phases to said A/D converters;

a delay device which delays an output of each said A/D converters by a time corresponding to a cycle of said sampling clock signal;

a multiplier which multiplies outputs of said delay device by predetermined coefficients and which outputs the thus-multiplied signals;

a totalizer which outputs the total of outputs provided from said multiplier; and an alternate output which outputs an output of said delay device and an output of said totalizer in an alternate manner, the output of the delay device being spaced a predetermined time from a time point at which the output of said totalizer takes a maximum value.

2. An input delay correcting method for an input delay correcting system for an A/D converter having a plurality of A/D converter means for converting analog signal into digital signals in synchronism with a sampling clock signal; and a clock signal supply means which supplies said sampling clock signal in different phases to said A/D converter means, said method comprising:

a delay step which delays an output of each said A/D converter means by a time corresponding to a cycle of said sampling clock signal;

a multiplier step which multiplies outputs of said delay step by predetermined coefficients and which outputs the thus-multiplied signals;

a totalizer step which outputs the total of outputs provided from said multiplier step; and an alternate output step which outputs an output of said delay step and an output of said totalizer step in an alternate manner, the output of the delay step being spaced a predetermined time from a time point at which the output of said totalizer step takes a maximum value.

3. A computer-readable medium having a program of instructions for execution by the computer to perform an input delay correcting process for an input delay correcting system for au A/D converter having a plurality of A/D converter means for converting analog signal into digital signals in synchronism with a sampling clock signal; and a clock signal supply means which supplies said sampling clock signal in different phases to said A/D converter means, said input delay correcting process comprising:

a delay processing which delays an output of each said A/D converter means by a time corresponding to a cycle of said sampling clock signal;

a multiplier processing which multiplies outputs of said delay processing by predetermined coefficients and which outputs the thus-multiplied signals;

a totalizer processing which outputs the total of outputs provided from said multiplier processing; and an alternate output processing which outputs an output of said delay processing and an output of said totalizer processing in an alternate manner, the output of the delay processing being spaced a predetermined time from a time point at which the output of said totalizer processing takes a maximum value.

* * * * *